(12) United States Patent
Otani et al.

(10) Patent No.: US 6,977,822 B2
(45) Date of Patent: Dec. 20, 2005

(54) SHIELD CASE FOR ELECTRONIC APPARATUS

(75) Inventors: Koji Otani, Atsugi (JP); Yutaka Tanaka, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 161 days.

(21) Appl. No.: 10/336,092

(22) Filed: Jan. 3, 2003

(65) Prior Publication Data

US 2003/0128534 A1 Jul. 10, 2003

(30) Foreign Application Priority Data

Jan. 8, 2002 (JP) .................................... 2002-001194

(51) Int. Cl.⁷ ................................................ H05K 7/14
(52) U.S. Cl. ...................... 361/800; 361/818; 361/797; 174/35 R; 439/76.1; 439/76.2
(58) Field of Search ................................. 361/800, 816, 361/818, 797, 752, 715; 174/35 R, 35 MS, 51; 439/76.1, 76.2

(56) References Cited

U.S. PATENT DOCUMENTS 5,414,597 A * 5/1995 Lindland et al. ............ 361/816

FOREIGN PATENT DOCUMENTS

| JP | 3-104978 | 10/1991 |
| JP | 07 296789 | 11/1995 |
| JP | 09 129290 | 5/1997 |
| JP | 10 189206 | 7/1998 |
| JP | 10326647 | 12/1998 |

* cited by examiner

*Primary Examiner*—Randy Gibson
*Assistant Examiner*—Hung S. Bui
(74) *Attorney, Agent, or Firm*—Ladas & Parry LLP

(57) ABSTRACT

The position of a connector 36 in the forward direction (Ya direction) is determined by having front end surfaces 36f1, 36g1 of protrusions 36f, 36g of the connector that protrude from the left side surface and the right side surface of the connector, respectively, contacting vertical wall portions 72a1, 74a1 of positioning concave portions 72a, 74a of supporting plates 72, 74 of a housing of the shield case. The position of the connector in the backward direction (Yb direction) is determined by having a back surface 36h of the connector 36 contacting a protrusion 70a of a dividing plate 70. The motion of the connector in the right-and-left directions (Xa–Xb directions) is controlled by having the left side surface and the right side surface of the connector facing the supporting plates, respectively, in close proximity. Since the connector is held in a status where no shaking occurs in any direction, there is no need to be sensitive about the assembling accuracy of the portion of the stereo device corresponding to the position of the electronic apparatus, and thus more freedom for back surface panel configuration of the stereo devices can be provided and this reduces the burden of the manufacturers when manufacturing the stereo devices.

11 Claims, 14 Drawing Sheets

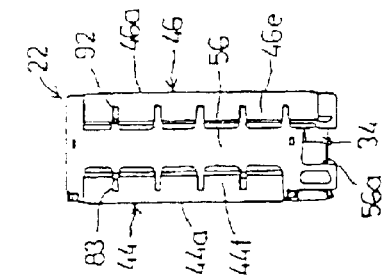
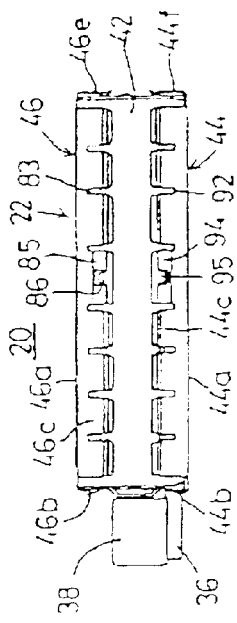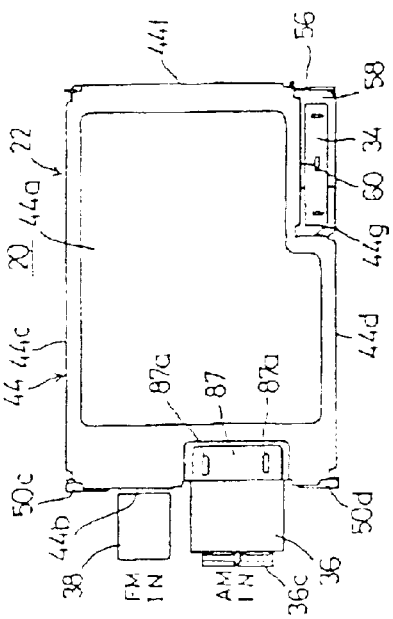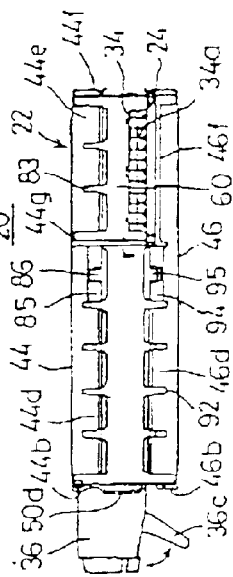
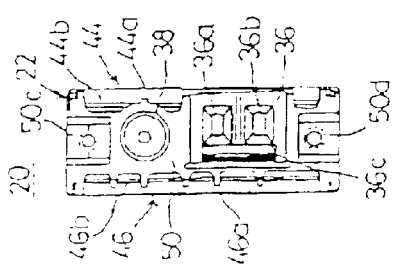

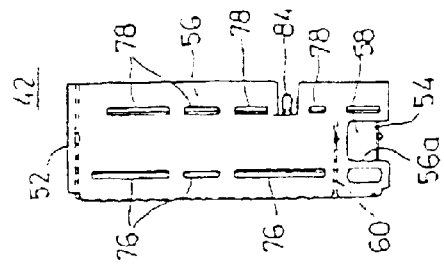
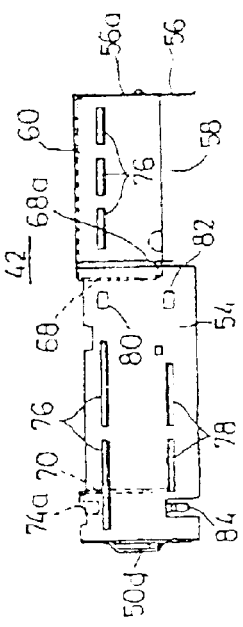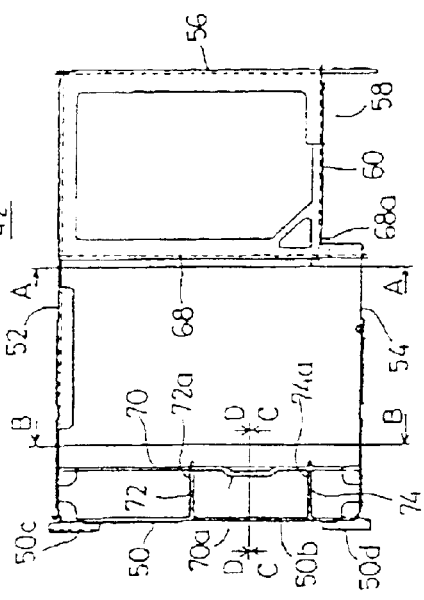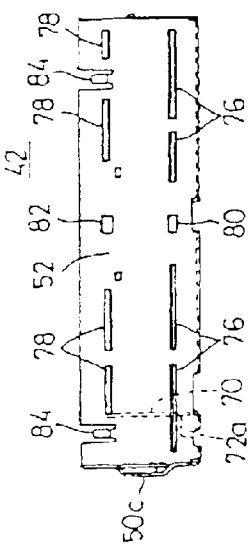
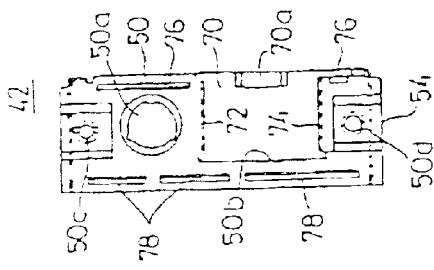

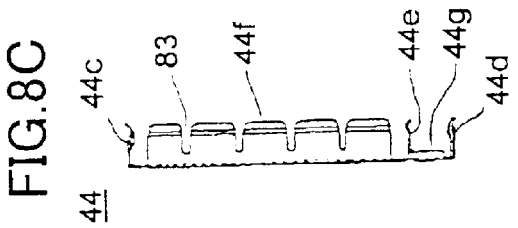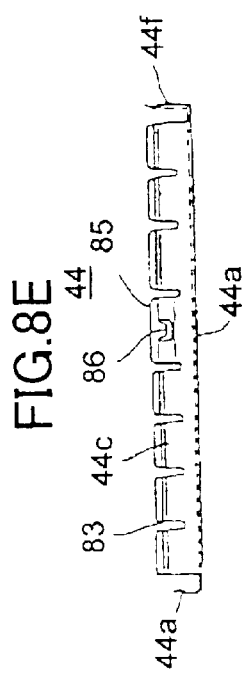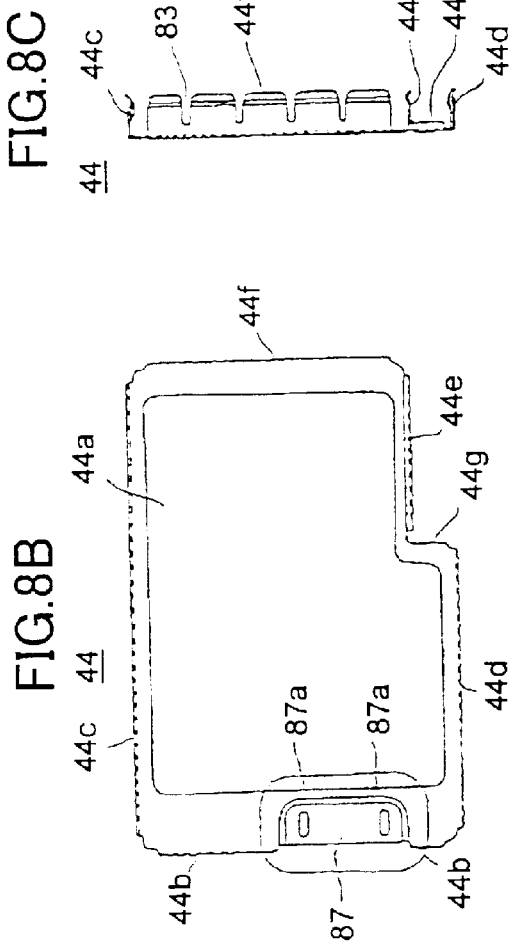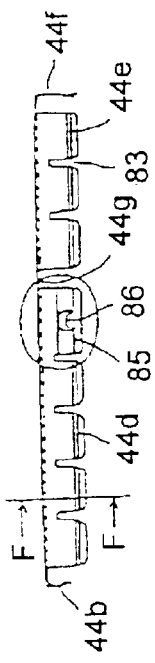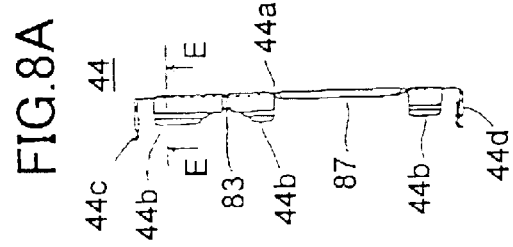

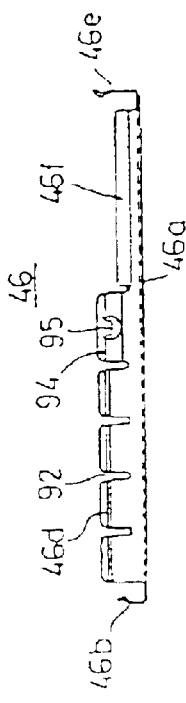
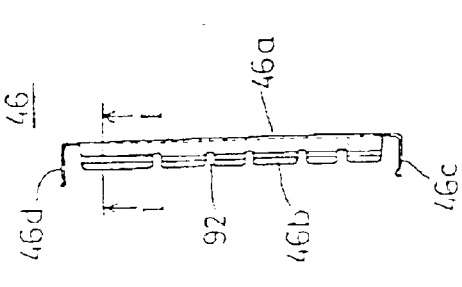
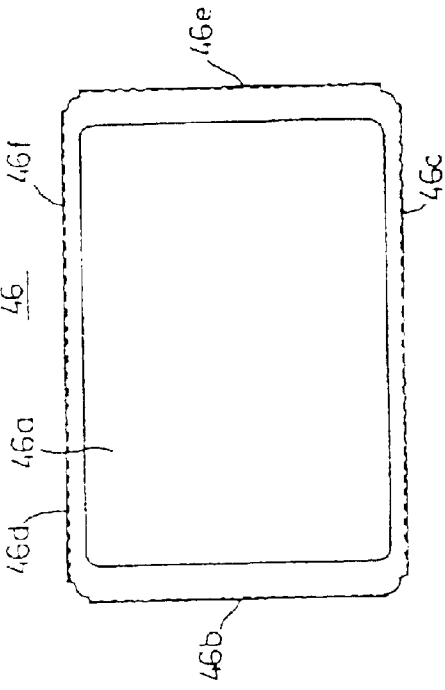
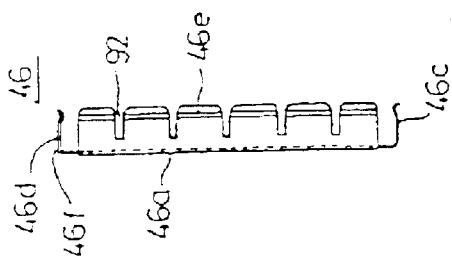
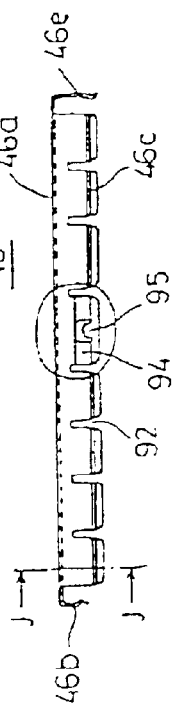

SHIELD CASE FOR ELECTRONIC APPARATUS

BACKGROUND OF THE INVENTION

1. Field of the Invention

The present invention relates to a shield case for an electronic apparatus and more particularly to a shield case for an electronic apparatus that accommodates a board arranged with an electronic component and a connector.

2. Description of the Related Art

An electronic apparatus such as an AM/FM tuner includes a printed circuit board that is arranged with an AM input connector to which an AM antenna wire is connected, an FM input connector to which an FM antenna wire is connected, and an output connector. The printed circuit board is further arranged with various electronic components including an AM front-end part that receives an amplitude-modulated (AM) wave from the AM antenna wire, an FM front-end part that receives a frequency-modulated (FM) wave from the FM antenna wire, a phase-locked loop (PLL) part that fixes to and provides a selected frequency wave, an FM/AM wave detection/stereo demodulation part that generates voice signals from the AM wave or the FM wave, and so on. The output connector provides the demodulated voice signals to an amplifier device, etc. that is located outside of the electronic apparatus. The connectors and the electronic components are arranged on both sides of the printed circuit board. The printed circuit board is covered by a shield case that is formed in the shape of a box.

The shield case for the electronic apparatus according to the related art is configured so as to hermetically accommodate the printed circuit board inside the shield case in order to shield electronic/magnetic/electromagnetic noise from the exterior. The AM input connector, the FM input connector, and the output connector are exposed on the side surfaces of the shield case. In addition, the AM input connector is provided with a pair of insert holes to which the AM antenna wires are inserted, a locking mechanism that locks end portions of the AM antenna wires inserted in the insert holes in a conductive status, a pair of terminals to be soldered to the printed circuit board, and a pair of engaging pawls that engage with mounting holes in the printed circuit board.

According to the related art, the AM input connector is firmly connected to the printed circuit board by the pair of terminals and the pair of engaging pawls. However, with respect to the shield case, only a back surface of the AM input connector contacts a case wall of the shield case. When the AM/FM tuner is mounted to a back surface panel of a housing of a stereo device, the AM input connector is supported between the back surface panel of the stereo device and the case wall of the shield case.

According to the related art, since the AM input connector is mounted so that the AM input connector is supported between the back surface panel of the stereo device and the case wall of the shield case, it is necessary to manufacture the back surface panel of the stereo device so as to correspond to the mounting position and the shape of the AM input connector in terms of size. Such a necessity is a constraint when manufacturing back surface panels of the stereo device.

Therefore, with respect to the shield case for an electronic apparatus according to the related art, it is necessary for the stereo device manufacturers to manufacture stereo devices that have a configuration to hold the AM input connectors in place. This is rather a burden for the stereo device manufacturers.

SUMMARY OF THE INVENTION

Accordingly, it is a general object of the present invention to provide a shield case for an electronic apparatus, which shield case overcomes the problem according to the related art. In more detail, it is an object of the present invention to provide a shield case for an electronic apparatus, by which shield case, a connector can be stably mounted to the board of the electronic apparatus without depending on a back surface panel of a stereo device, to which the electronic apparatus is connected.

According to the present invention, there is provided a shield case for an electronic apparatus that accommodates a board arranged with an electronic component and a connector comprising, a housing that comprises a plurality of housing walls, a top cover that covers an upper portion of said housing, and a bottom cover that covers a bottom portion of said housing. The connector is provided with a protrusion, one of the plurality of housing walls is provided with a concave portion, and the protrusion provided on the connector engages with the concave portion provided on the one of housing walls.

In the shield case for an electronic apparatus according to the present invention, since the protrusion provided on the connector engages with the concave portion provided on one of the housing walls, the mounting position of the connector is controlled. Therefore, it is not necessary to hold the connector between one of the housing walls and a back surface panel of a stereo device, to which the shield case is connected, and more freedom for a back surface panel configuration of the stereo device can be provided and this reduces the burden of the manufacturers when manufacturing the stereo devices.

According to the present invention, there is provided a shield case for an electronic apparatus that accommodates a board arranged with an electronic component and a connector, which shield case comprises a housing that comprises a plurality of housing walls, a top cover that covers an upper portion of the housing, and a bottom cover that covers a bottom portion of the housing. The connector is provided with a protrusion, one of the housing wall is provided with a contacting portion, another one of the housing walls contacts the protrusion provided on the connector, and the contacting portion contacts a back surface of the connector so as to control a position of the connector in a direction toward an interior space of the housing.

In the shield case for an electronic apparatus according to the present invention, since one of the housing walls contacts the protrusion provided on the connector and the contacting portion contacts the back surface of the connector, it is not necessary to hold the connector between one of the housing walls and a back surface panel of a stereo device. Therefore more freedom for back surface panel configuration of the stereo devices can be provided and this reduces the burden of the manufacturers when manufacturing the stereo devices.

According to the present invention, the top cover is provided with a connector-gripping portion that grips the connector from the top.

In the shield case for an electronic apparatus according to the present invention, since the connector is gripped by the connector-gripping portion from the top, it is possible to determine the mounting position of the connector in an upward direction.

BRIEF DESCRIPTION OF THE DRAWINGS

FIG. 2A shows a front elevational view of the shield case for an electronic apparatus according to the embodiment of the present invention in an assembled status;

FIG. 2B shows a plan view of the shield case for an electronic apparatus according to the embodiment in the assembled status;

FIG. 2C shows a rear elevational view of the shield case for an electronic apparatus according to the embodiment in the assembled status;

FIG. 2D shows a right side elevational view of the shield case for an electronic apparatus according to the embodiment in the assembled status;

FIG. 2E shows a left side elevational view of the shield case for an electronic apparatus according to the embodiment in the assembled status;

FIG. 4A shows a font elevational view of the configuration of the housing 42;

FIG. 4B shows a plan view of the configuration of the housing 42;

FIG. 4C shows a rear elevational view of the configuration of the housing 42;

FIG. 4D shows a right side elevational view of the configuration of the housing 42;

FIG. 4E shows a left side elevational view of the configuration of the housing 42;

FIG. 8A shows a front elevational view of a configuration of a top cover 44;

FIG. 8B shows a plan view of the configuration of the top cover 44;

FIG. 8C shows a rear elevational view of the configuration of the top cover 44;

FIG. 8D shows a right side elevational view of the configuration of the top cover 44;

FIG. 8E shows a left side elevational view of the configuration of the top cover 44;

FIG. 13A shows a front elevational view of a configuration of a bottom cover 46;

FIG. 13B shows a bottom plan view of the configuration of the bottom cover 46;

FIG. 13C shows a rear elevational view of the configuration of the bottom cover 46;

FIG. 13D shows a left side elevational view of the configuration of the bottom cover 46;

FIG. 13E shows a right side elevational view of the configuration of the bottom cover 46;

DETAILED DESCRIPTION OF THE PREFERRED EMBODIMENTS

In the following, a principle and an embodiment of the present invention will be described with reference to the accompanying drawings.

Figure 1:
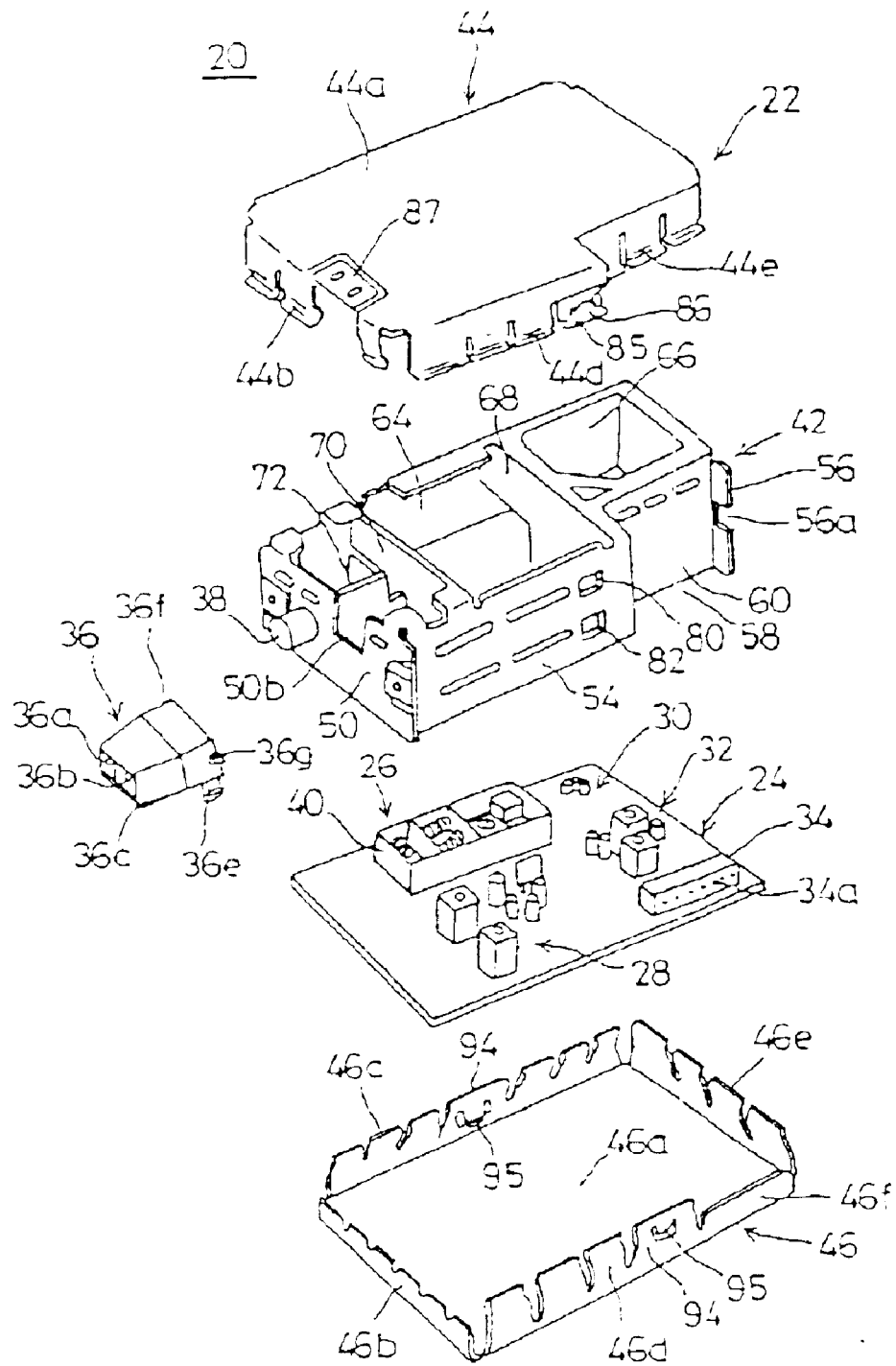
FIG. 1 shows an exploded perspective view of a shield case for an electronic apparatus according to one embodiment of the present invention.

FIG. 1 shows an exploded perspective view of a shield case for an electronic apparatus according to an embodiment of the present invention. FIG. 2A through FIG. 2E show the shield case for an electronic apparatus according to the embodiment in an assembled status. More particularly, FIG. 2A shows a front elevational view of the shield case for an electronic apparatus according to the embodiment in the assembled status, FIG. 2B shows a plan view of the shield case for an electronic apparatus according to the embodiment in the assembled status, FIG. 2C shows a rear elevational view of the shield case for an electronic apparatus according to the embodiment in the assembled status, FIG. 2D shows a right side elevational view of the shield case for an electronic apparatus according to the embodiment in the assembled status, and FIG. 2E shows a left side elevational view of the shield case for an electronic apparatus according to the embodiment in the assembled status.

As shown in FIG. 1 and FIG. 2A through FIG. 2E, an electronic apparatus 20 such as an AM/FM tuner is configured so as to accommodate a printed circuit board 24 inside the hermetically sealed space of a shield case 22. Onto the printed circuit board 24, various electronic components including an FM front-end part 26 that receives an FM wave from an FM antenna wire (not shown), an AM front-end part 28 that receives an AM wave from an FM antenna wire (not shown), a phase-locked loop (PLL) part 30 that fixes to and provides a selected frequency wave, and an FM/AM wave detection/stereo demodulation part that generates audio signals from the AM wave or the FM wave are soldered. An output connector 34 that provides the demodulated audio signals to an amplifier device, etc. that is located outside of the electronic apparatus is also soldered onto the printed circuit board 24.

Coils and variable resistors of respective circuits and the output connector 34 are arranged on a top surface of the printed circuit board 24 and IC chips and DIP components, etc. are arranged on an under surface of the printed circuit board 24. In addition, on a side surface of the output connector 34, which side surface is facing opposite to a right side surface of the shield case 22, a plurality of insert holes 34a to which terminals such as cables (not shown) are inserted are provided and arranged in a row.

An AM input connector 36 and an FM input connector 38 are mounted to a front surface of the shield case 22 so that the AM input connector 36 and the FM input connector 38 are exposed to the exterior. The AM input connector 36 has a pair of insert holes 36a, 36b on its front surface, to which pair of insert holes 36a, 36b a pair of AM antenna wires are inserted. The AM input connector 36 further has a locking lever 36c that is rotatably mounted underneath the pair of insert holes 36a, 36b and that locks the pair of AM antenna wires when inserted into the insert holes 36a, 36b. The AM input connector 36 further has a pair of latching pawls 36d, 36e (in FIG. 1, only the latching pawl 36e is visible), provided on its under surface, which pair of latching pawls 36d, 36e are engagingly latched onto latching holes (not shown) in the printed circuit board 24. The AM input connector 36 further has a pair of protrusions 36f, 36g provided on a right side surface and a left side surface of the AM input connector 36, respectively, each of the., protrusions 36f, 36g engages with positioning concave portions in the shield case 22 (to be described later). The FM input connector 38 has a cylindrical portion that is directly fixed to the front surface of the shield case 22.

Each coil configuring the FM front-end part 26 is arranged so as to be accommodated in a space surrounded by shielding members 40 mounted on the printed circuit board 24.

The shield case 22 is configured from a housing 42 that is formed so as to enclose respective electronic components arranged on the top surface of the printed circuit board 24, a top cover 44 mounted to the upper portion of the housing 42 so as to close off the upper opening of the housing 42, and a bottom cover 46 mounted to the bottom portion of the housing 42 so as to face the under surface of the printed circuit board 24. Accordingly, each electronic component soldered onto both sides of the printed circuit board 24 is accommodated inside the hermetically sealed space formed by the top cover 44 and the bottom cover 46 of the housing 42 and electromagnetic waves from the exterior are prevented from entering the shield case 22.

The following are descriptions of configuration of each part of the shield case 22.

Figure 3A:
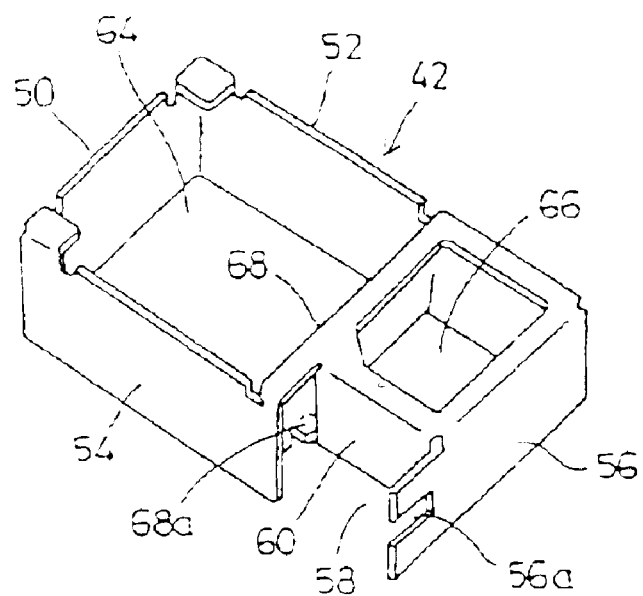
FIG. 3A shows a perspective view of a configuration of a housing 42.
Figure 3B:
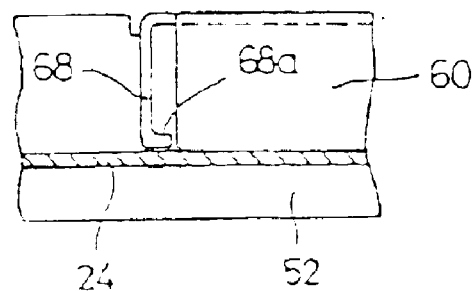
FIG. 3B shows an enlarged view of a section of the housing 42.

FIG. 3A and FIG. 3B show a configuration of the housing 42, respectively. More particularly, FIG. 3A shows a perspective view of the configuration of the housing 42 and FIG. 3B shows an enlarged view of a section of the housing 42. FIG. 4A through FIG. 4E also show the configuration of the housing 42. More particularly, FIG. 4A shows a front elevational view of the configuration of the housing 42, FIG. 4B shows a plan view of the configuration of the housing 42, FIG. 4C shows a rear elevational view of the configuration of the housing 42, FIG. 4D shows a right side elevational view of the configuration of the housing 42, and FIG. 4E shows a left side elevational view of the configuration of the housing 42.

As shown in FIG. 3A and FIG. 3B, and FIG. 4A through FIG. 4E, the housing 42 is formed by pressing sheet metal made from shield material that blocks electromagnetic waves into the shape of a casing and has a front plate 50 to which the AM input connector 36 and the FM input connector 38 are mounted, a left side plate 52 situated on the left hand side of the printed circuit board 24, a right side plate 54 situated on the right hand side of the printed circuit board 24, a back plate 56 situated on the back side of the printed circuit board 24, a concave portion 58 formed on the right hand side of the printed circuit board 24 so as to expose the output connector 34, and a concave portion side plate 60 that forms the concave portion 58.

In addition, in the interior of the housing 42, a first chamber 64 that accommodates the electronic components such as the FM front-end part 26 and the AM front-end part 28 and a second chamber 66 that accommodates the electronic components such as the PLL part 30 and the FM/AM wave detection/stereo demodulation part 32 are formed on the printed circuit board 24. The first chamber 64 and the second chamber 66 are separated by a division wall 68. In the first chamber 64, a dividing plate 70 is provided in parallel with the front plate 50.

The front plate 50 is provided with a mounting hole 50a to which the cylindrical portion of the FM input connector 38 is fixed, a concave portion 50b with which the AM input connector is engaged, and screw holes 50c, 50d for fixing the shield case 22 to the stereo device housing 42. Between the dividing plate 70 and the front plate 50, supporting plates 72, 74 (both of which are parts of the front plate, i.e. the case wall, bent inwardly to the interior space of the housing 42) that support both side surfaces of the AM input connector 36 when inserted into the concave portion 50b. End portions of the supporting plates 72, 74 engage with the dividing plate 70 so that the supporting plates 72, 74 also serve as reinforcing members.

Positioning concave portions (notches) 72a, 74a with which the pair of protrusions 36f, 36g of the AM input connector 36 engage are provided at the top ends of the supporting plates 72, 74, respectively, in order to control the mounting position of the AM input connector 36. A protrusion 70a is provided on the dividing plate 70 in order to control the position of the back surface of the AM input surface 36.

Respective top end portions of the dividing wall 68, a portion of the left side plate 52 that surrounds the second chamber 66, the back plate 56, and the concave portion side plate 60 are bent in the L-shape so as to increase rigidity. The concave portion 58 is formed at the position where the output connector 34 is to be mounted on the printed circuit board 24, which concave portion 58 has openings opened in a side direction, an up direction, and a down direction so that the output connector 34 arranged on the printed circuit board 24 can be seen and checked from a side and above. Therefore, when terminals of a flat cable (not shown) are to be inserted in the plurality of insert holes 34a of the output connector 34, the insertion operation can be performed from the side or the above of the output connector 34.

The output connector 34 according to the embodiment of the present invention is a connector having a plurality of insert holes on its side surface. However, a connector having a plurality of insert holes on its top surface may be mounted on the print circuit 24 as the output connector 34. Accordingly, the connector having the plurality of insert holes on its side surface and the connector having the plurality of insert holes on its top surface can be selectively used as the output connector 34 depending on a user's request.

The top end of the concave portion side plate 60 lies between the dividing wall 68 and the back plate 56 and the bottom end contacts the top surface of the printed circuit board 24. A left side portion of the concave portion side plate 60 contacts a protrusion 68a that is cut from the dividing wall 68 and is bent in a horizontal direction. Thus a gap is formed between the left side portion of the concave portion side plate 60 and the dividing wall 68, however, since the motion of the concave portion side plate 60 is controlled by having the left side portion of the concave portion side plate 60 contacting the protrusion 68a (see FIG. 3A and FIG. 3B), it is possible to prevent the concave portion side plate 60 from shaking before being assembled into the electronic apparatus.

An opening 56a is provided on a portion of the back plate 56 that corresponds to the output connector 34 so that the side surface of the output connector 34 can be observed from the back surface side. The opening 56a is cut through in the shape of a rectangle and one side of which is extended to the right side surface so that the opening 56a forms the shape of a horseshoe.

A plurality of upper bulges 76 for latching rims of the top cover 44 (to be described later) and a plurality of lower bulges 78 for latching rims of the bottom cover 78 are provided at predetermined intervals on the front plate 50, the left side plate 52, the right side plate 54, the back plate 56, and the concave portion side plate 60 so as to protrude outwardly. The respective upper bulges 76 and the lower bulges 78 have R-shaped cross-sections so that the rims of the top cover 44 and the bottom cover 46 can go over the respective upper bulges 76 and lower bulges 78.

A rectangular upper latching hole 80 that prevents the top cover 44 from falling off from the shield case 22 and a rectangular bottom latching hole 82 that prevents the bottom cover 46 from falling off from the shield case 22 are provided in the middle portions of the left side plate 52 and the right side plate 54, respectively.

Further, a fixing portion 84 which is to be soldered to rims of the printed circuit board 24 is provided on the left side plate 52, the right side plate 54, and the back plate 56, respectively. The fixing portion 84 has an elongate shape and is bent inwardly so as to contact the rims of the printed circuit board 24 and to be soldered thereat.

Figure 5A:
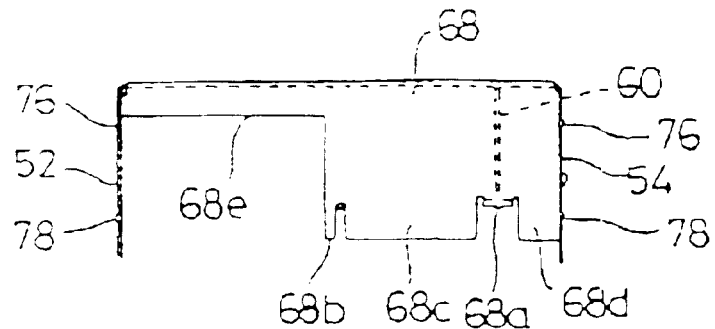
FIG. 5A shows a cross-sectional view through section A—A of FIG. 4B that shows the plan view of the housing 42.
Figure 5B:
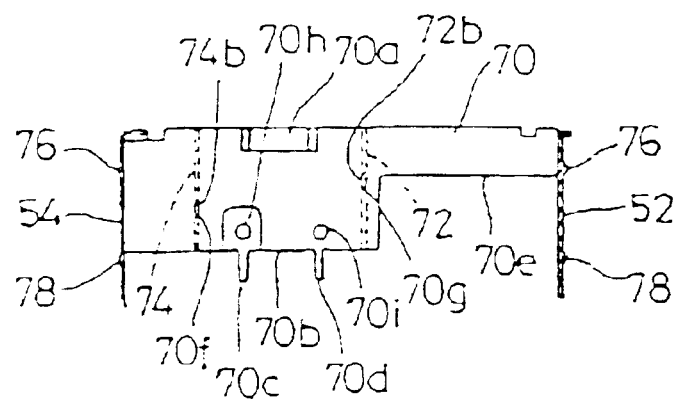
FIG. 5B shows a cross-sectional view through section B—B of FIG. 4B that shows the plan view of the housing 42.
Figure 5C:
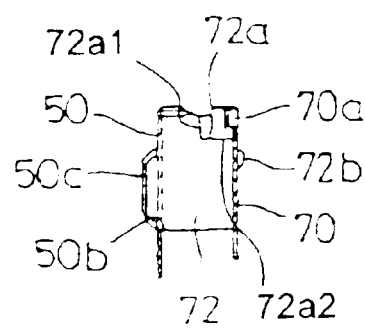
FIG. 5C shows a cross-sectional view through section C—C of FIG. 4B that shows the plan view of the housing 42.
Figure 5D:
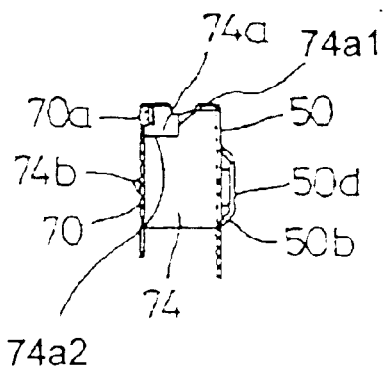
FIG. 5D shows a cross-sectional view through section D—D of FIG. 4B that shows the plan view of the housing 42.

FIG. 5A through FIG. 5D show parts of the configuration of the housing 42, respectively. More particularly, FIG. 5A shows a cross-sectional view through section A—A of FIG. 4B that shows the plan view of the housing 42, FIG. 5B shows a cross-sectional view through section B—B of FIG. 4B that shows the plan view of the housing 42, FIG. 5C shows a cross-sectional view through section C—C of FIG. 4B that shows the plan view of the housing 42, and FIG. 5D shows a cross-sectional view through section D—D of FIG. 4B that shows the plan view of the housing 42.

As shown in FIG. 5A, the dividing wall 68 lies between the left side plate 52 and the right side plate 54. In addition to the protrusion 68a, the dividing wall 68 is provided with a plurality of engaging portions 68b, 68c, and 68d for engaging with slits (not shown) formed on the printed circuit board 24 and a clearance portion 68e so as not to contact the shielding members 40 on the printed circuit board 24.

The engaging portion 68b protrudes in the elongate shape and penetrates the printed circuit board 24 so as to be soldered at the under surface of the printed circuit board 24.

As shown in FIG. 5B, in addition to the protrusion 70a, the dividing plate 70 is provided with a contacting portion 70b that contacts the printed circuit board 24, engaging portions 70c, 70d that protrude further downward from the lower end of the contacting portion 70b in order to engage with slits (not shown) formed in the printed circuit board 24, a clearance portion 70e formed so as not to contact the shield members 40 on the printed circuit board 24, latching holes 70f, 70g with which protrusions 72b, 74b of the supporting plates 72, 74 are engaged, and latching holes 70h, 70i with which positioning protrusions (not shown) protruding from the back surface of the AM input connector 36 are engaged.

As shown in FIG. 5C, the supporting plate 72 that is formed by bending a portion of the front plate 50 inwardly has the positioning concave portion 72a that controls the mounting position of the AM input connector 36 and the protrusion 72b that engages with the latching hole 70f of the dividing plate 70.

As shown in FIG. 5D, the supporting plate 74 that is formed by bending a portion of the front plate 50 inwardly has the positioning concave portion 74a that controls the mounting position of the AM input connector 36 and the protrusion 74b that engages with the latching hole 70g of the dividing plate 70.

The positioning concave portions 72a, 74a of the supporting plates 72, 74 are provided at positions that correspond to the protrusions 36f, 36g that are provided outwardly on both side surfaces of the AM input connector 36. Accordingly, since the up-down motion of the AM input connector 36 is controlled by having the pair of latching pawls 36d, 36e engaged with the latching holes (not shown) in the printed circuit board 24, and since the strength in a back-and-forth direction is reinforced by having the pair of protrusions 36f, 36g engaged with the positioning concave portions 72a, 74a and by having the back surface of the AM input connector 36 contacting the protrusion 70a of the dividing plate 70, the AM input connector 36 can be held by the shield case 22 without shaking.

Figure 6:
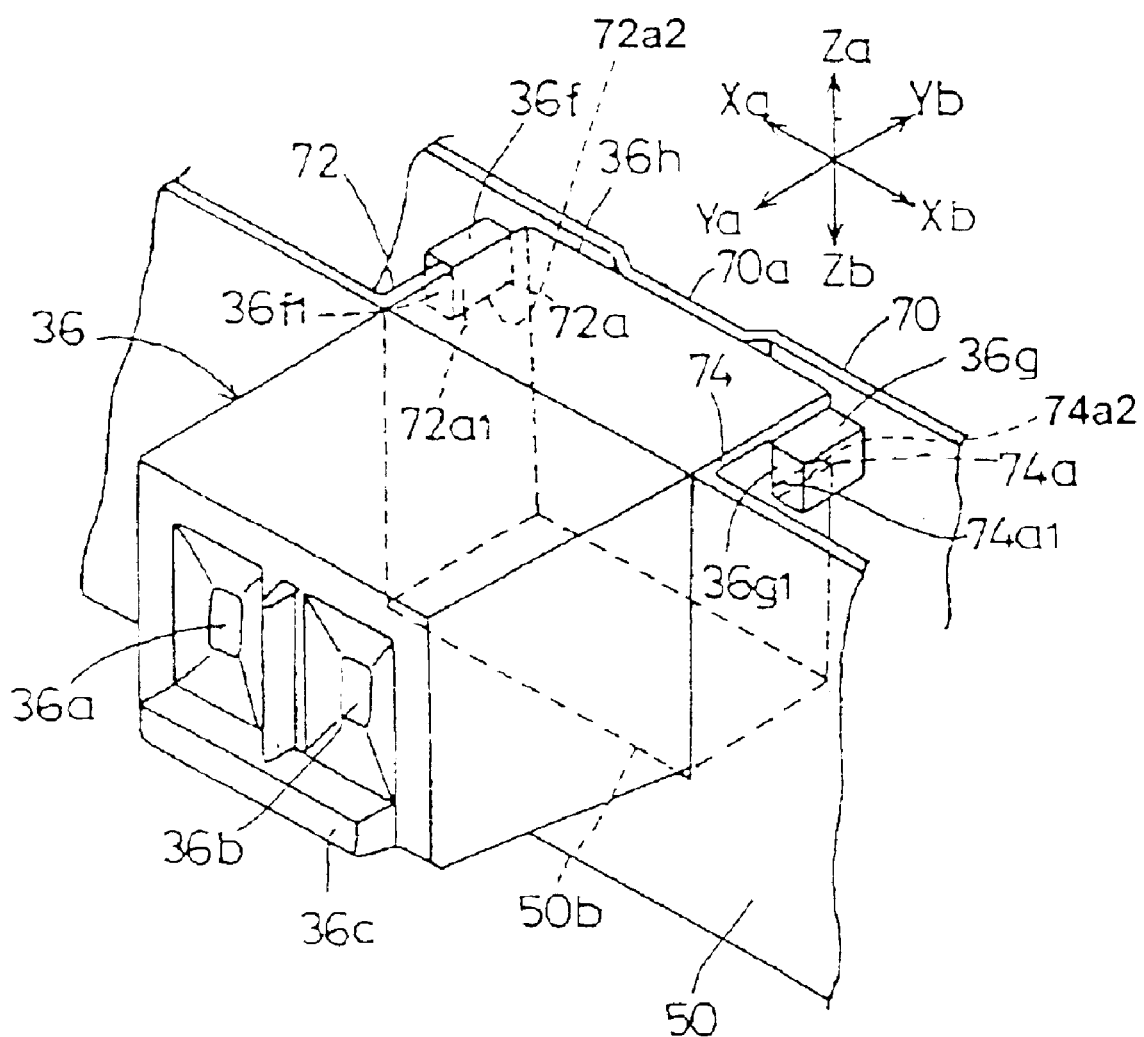
FIG. 6 shows a perspective view of a mounting configuration of an AM input connector 36.
Figure 7B:
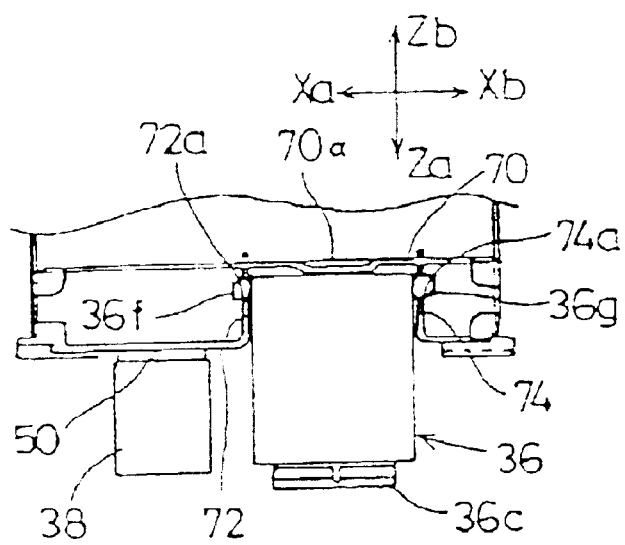
FIG. 7B shows a plan view of the AM input connector 36 in a mounted status.
Figure 7A:
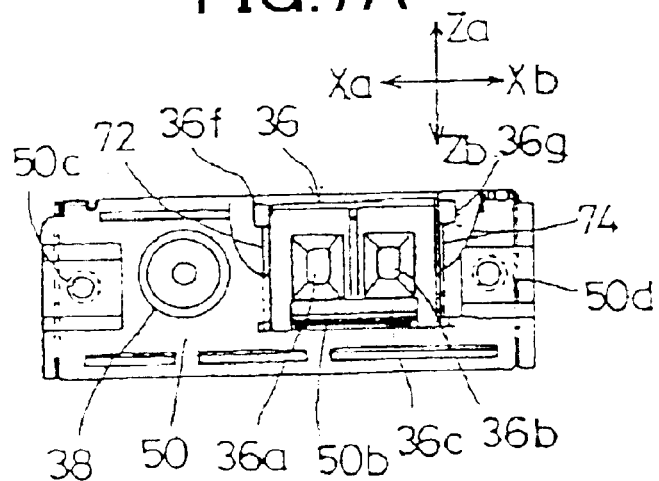
FIG. 7A shows a front elevational view of the AM input connector 36 in a mounted status.
Figure 7C:
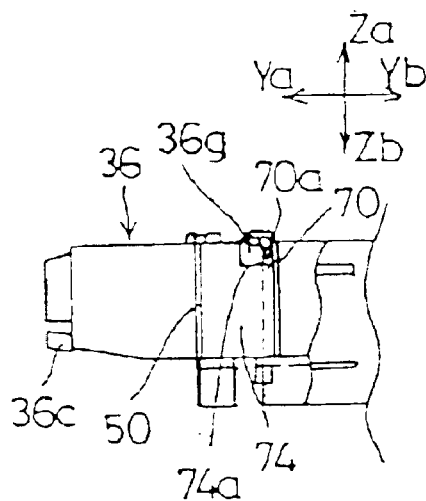
FIG. 7C shows a side elevational view of the AM input connector 36 in the mounted status.

FIG. 6 shows a perspective view of a mounting configuration of the AM input connector 36. FIG. 7A though FIG. 7C show the AM input connector 36 in a mounted status. More particularly, FIG. 7A shows a front elevational view of the AM input connector 36 in the mounted status, FIG. 7B shows a plan view of the AM input connector 36 in the mounted status, and FIG. 7C shows a side elevational view of the AM input connector 36 in the mounted status.

As shown in FIG. 6 and FIG. 7A through FIG. 7C, the position of the AM input connector 36 in the forward direction (Ya direction) is determined by having front end surfaces 36f1, 36g1 of the protrusions 36f, 36g that protrude from the left side surface and the right side surface of the AM input connector, respectively, contacting vertical wall portions 72a1, 74a1 of the positioning concave portions 72a, 74a. The position of the AM input connector 36 in the backward direction (Yb direction) is determined by having the back surface 36h of the AM input connector 36 contacting the protrusion 70a of the dividing plate 70.

Further, the motion of the AM input connector 36 in the right-and-left directions (Xa–Xb directions) is controlled since the left side surface and the right side surface of the AM input connector 36 face the supporting plates 72, 74, respectively, in close proximity.

In addition, the position of the AM input connector 36 in the up-and-down directions (Za–Zb directions) is controlled by having the latching pawls 36d, 36e, which are protruding downward from the under surface of the AM input connector 36, engaged with the latching holes (not shown) in the printed circuit board 24 and by having bottom end surfaces of the protrusions 36f, 36g of the AM input connector 36 contacting with horizontal wall portions 72a2, 74a2 of the positioning concave portions 72a, 74a.

As described above, according to the present invention, the AM input connector 36 is held in a status where no shaking occurs in any direction. Therefore, it is not necessary for the shield case for the electronic apparatus 20 to have a configuration so as to contact the housing (back surface panel) of the stereo device, to which housing the electronic apparatus 20 is mounted, in order to prevent the shaking in the back-and-forth directions (Ya–Yb directions) as in the related art. Accordingly, it is only necessary to provide openings for passing through the AM input connector 36 and the FM input connector 36 in the back surface panel of the stereo device. Therefore, there is no need to be sensitive about the assembling accuracy of the portion of the stereo device corresponding to the position of the electronic apparatus 20, and thus more freedom for back surface panel configuration of the stereo devices can be provided and this reduces the burden of the manufacturers when manufacturing the stereo devices.

FIG. 8A through FIG. 8E show a configuration of the top cover 44. More particularly, FIG. 8A shows a front elevational view of the configuration of the top cover 44, FIG. 8B shows a plan view of the configuration of the top cover 44, FIG. 8C shows a rear elevational view of the configuration of the top cover 44, FIG. 8D shows a right side elevational view of the configuration of the top cover 44, and FIG. 8E shows a left side elevational view of the configuration of the top cover 44.

As shown in FIG. 8A through FIG. 8E, the top cover 44 has a top surface 44a that closes off the upper opening of the housing 42, a front engaging part 44b that is bent downward (i.e. inwardly with respect to the interior space of the housing 42) at the front end of the top surface 44a, a left engaging part 44c that is bent downward at the left end of the top surface 44a, a first right engaging part 44d that is bent downward at the right end of the top surface 44a, a second right engaging part 44e that is bent downward at the portion of the right end of the top surface 44a that corresponds to the concave portion side plate 60, a back engaging part 44f that is bent downward at the back end of the top surface 44a, and an engaging part 44g that is bent downward so as to correspond to the concave portion 58.

A plurality of notches 83 are provided at predetermined intervals on the front engaging part 44b, the left engaging part 44c, the first right engaging part, 44d, the second right engaging part 44e, and the back engaging part 44f so as to facilitate the engagement with the plurality of upper bulges 76 provided on the front plate 50, the left side plate 52, the right side plate 54, the back plate 56, and the concave portion side plate 60 of the housing 42.

A connector-gripping portion 87 is provided in a depressed manner on the top surface 44a of the top cover 44, which connector-gripping portion 87 grips the AM input connector 36 from above by contacting the top surface of the AM input connector 36. Further, a latching part 85 is provided at the middle portions of the left engaging part 44c and the first/second right engaging parts 44d, 44e, respectively, each engaging part bent downward from the respective side ends. Each of the latching parts 85 is provided with a latching piece 86 that fits into the respective upper latching holes 80 of the shield case 22 so as to prevent the top cover 44 from falling off from the shield case 22.

Figure 9A:
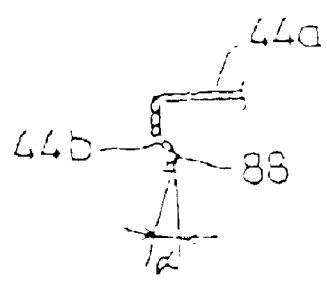
FIG. 9A shows a cross sectional view through section E—E of FIG. 8A that shows the front elevational view of the configuration of the top cover 44.
Figure 9B:
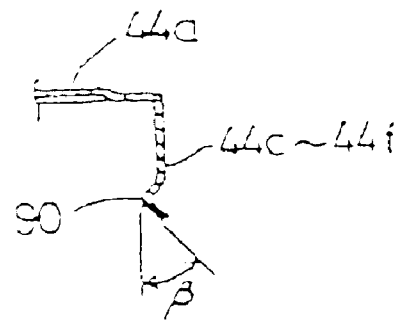
FIG. 9B shows a cross sectional view through section F—F of FIG. 8D that shows the right side elevational view of the configuration of the top cover 44.

FIG. 9A shows a cross-sectional view through section E—E of FIG. 8A that shows the front elevational view of the configuration of the top cover 44 and FIG. 9B shows a cross-sectional view through section F—F of FIG. 8D that shows the right side elevational view of the configuration of the top cover 44.

As shown in FIG. 9A and FIG. 9B, tip portions 88, 90 of the front engaging part 44b and the first right engaging part 44d, respectively, are bent in the dogleg shape. The same applies to the left engaging part 44c, the second right engaging part 44e, and the back engaging part 44f of the top cover 44. The bent tip portions 88, 90 deform so as to increase the value of the bending angles α, β when the bent tip portions 88, 90 go over the plurality of upper bulges 76 provided on the front plate 50, the left side plate 52, the right side plate 54, the back plate 56, and the concave portion side plate 60 of the housing 42. This facilitates the engagement of the bent tip portions 88, 90 with the plurality of upper bulges. When the tip portions 88, 90 of the front engaging part 44b, the left engaging part 44c, the first right engaging part 44d, the second right engaging part 44e, and the back engaging part 44f of the top cover 44 completely go over the plurality of upper bulges 76, the tip portions 88, 90 firmly engage with the plurality of upper bulges 76 so that falling off of the top cover 44 from the shield case 22 is prevented.

Figure 10A:
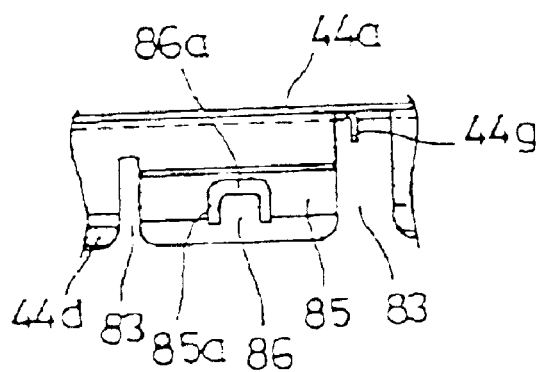
FIG. 10A shows an enlarged side elevational view of a latching part 85 of the top cover 44.
Figure 10B:
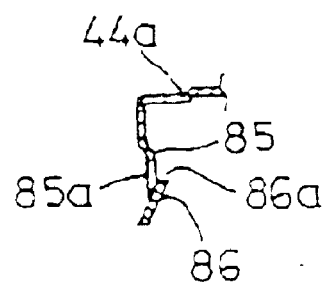
FIG. 10B shows a vertical cross-sectional view of the latching part 85 of the top cover 44.

FIG. 10A shows an enlarged side elevational view of the latching part 85 of the top cover 44 and FIG. 10B shows a vertical cross-sectional view of the latching part 85 of the top cover 44.

As shown in FIG. 10A and FIG. 10B, in the middle of the latching parts 85 that are bent downward from both side ends of the top surface 44a, a slit 85a in the shape of a horseshoe is cut out and the latching piece 86 is formed thereby, respectively. The lower end of the latching piece 86 is made integral with the latching part 85 and is configured so that the upper end 86a of the latching piece 86 diagonally enters into the interior space of the housing 42.

Figure 11A:
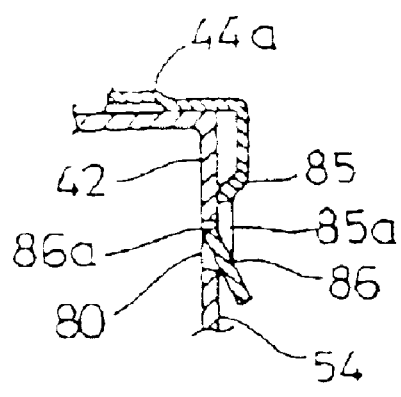
FIG. 11A shows a vertical cross-sectional view of the latching part 85 of the top cover 44, which is latched onto the housing 42.
Figure 11B:
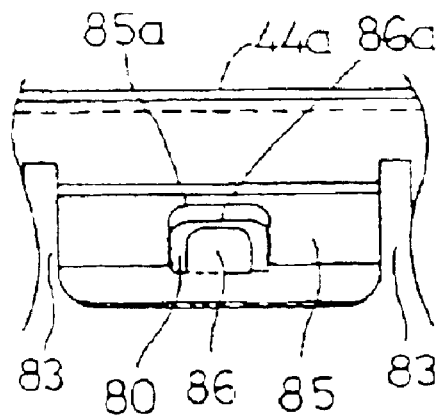
FIG. 11B shows an enlarged side elevational view of the latching part 85 of the top cover 44, which is latched onto the housing 42.

FIG. 11A shows a vertical cross-sectional view of the latching part 85 of the top cover 44, which latching part 85 is latched onto the housing 42 and FIG. 11B shows an enlarged side elevational view of the latching part 85 of the top cover 44, which latching part 85 is latched onto the housing 42.

As shown in FIG. 11A and FIG. 11B, when the top cover 44 is mounted to the upper portion of the housing 42, the upper ends, 86a of the latching pieces 86 fit into the upper latching holes 80 of the housing 42. Accordingly, it is assured that even when an exterior force is applied, the falling off of the top cover 44 from the housing 42 is prevented because the upper ends 86a of the latching pieces 86 are contacting the rim portions of the upper latching holes 80.

Figure 12A:
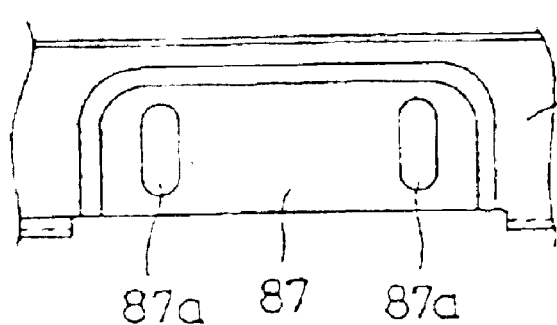
FIG. 12A shows an enlarged plan view of a connector-gripping portion 87 of the top cover 44.
Figure 12B:
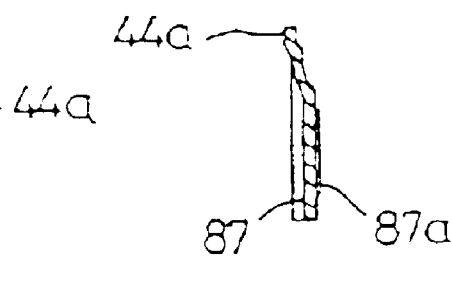
FIG. 12B shows a vertical cross-sectional view of the connector-gripping portion 87 of the top cover 44.

FIG. 12A shows an enlarged plan view of the connector-gripping portion 87 of the top cover 44 and FIG. 12B is a vertical cross-sectional view of the connector-gripping portion 87 of the top cover 44.

As shown in FIG. 12A and FIG. 12B, the connector-gripping portion 87 provided on the top surface 44a of the top cover 44 is provided at the position facing the top surface of the AM input connector 36. The connector-gripping portion 87 is provided in a depressed manner with respect to the top surface 44a of the top cover 44. A pair of contacting portions 87a that contact the top surface of the AM input connector 36 are provided in a further depressed manner so as to further protrude downward from the connector-gripping portion 87. Accordingly, the AM input connector 36 is supported between the concave portion 50b provided in the front plate 50 of the housing 42 and contacting portions 87a of the connector-gripping portion 87 without any shaking.

FIG. 13A through FIG. 13E show a configuration of the bottom cover 46. More particularly, FIG. 13A shows a front elevational view of the configuration of the bottom cover 46, FIG. 13B shows a bottom plan view of the configuration of the bottom cover 46, FIG. 13C shows a rear elevational view of the configuration of the bottom cover 46, FIG. 13D shows a left side elevational view of the configuration of the bottom cover 46, and FIG. 13E shows a right side elevational view of the configuration of the bottom cover 46.

As shown in FIG. 13A though FIG. 13E, the bottom cover 46 has a bottom surface 46a that closes off the bottom opening of the housing 42, a front engaging part 46b that is bent upward (i.e. inwardly with respect to the interior space of the housing 42) at the front end of the bottom surface 46a, a left engaging part 46c that is bent upward at the left end of the bottom surface 46a, a right engaging part 46d that is bent upward at the right end of the bottom surface 46a, a back engaging part 46e that is bent upward at the back end of the bottom surface 46a, and an engaging part 46f that is bent upward so as to correspond to the concave portion 58.

A plurality of notches 92 are provided at predetermined intervals on the front engaging part 46b, the left engaging part 46c, the right engaging part 46d, and the back engaging part 46e so as to facilitate the engagement with the plurality of lower bulges 78 provided on the front plate 50, the left side plate 52, the right side plate 54, the back plate 56, and the concave portion side plate 60, respectively, of the housing 42.

The middle portions of the left engaging part 46c and the right engaging part 46d, both of the engaging parts being bent upward from both side ends of the bottom surface 46a, are provided with a latching part 94, respectively. The latching parts 94 are provided with latching pieces 95 that prevent the falling off of the bottom cover 46 from the housing 42 by fitting into the lower latching holes 82 in the housing 42.

Figure 14A:
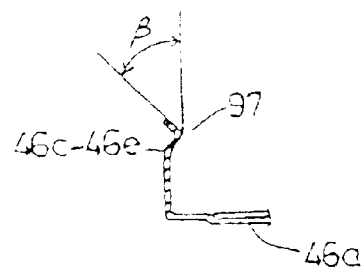
FIG. 14A shows a vertical cross-sectional view through section J—J of FIG. 13D that shows the left side elevational view of the configuration of the bottom cover 46.
Figure 14B:
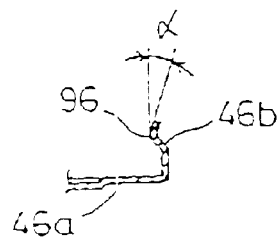
FIG. 14B shows a vertical cross-sectional view through section I—I of FIG. 13A that shows the front elevational view of the configuration of the bottom cover 46.

FIG. 14A shows a vertical cross-sectional view through section J—J of FIG. 13D that shows the left side elevational view of the configuration of the bottom cover 46 and FIG. 14B shows a vertical cross-sectional view through section I—I of FIG. 13A that shows the front elevational view of the configuration of the bottom cover 46.

As shown in FIG. 14A and FIG. 14B, tip portions 96, 97 of the front engaging part 46b and the left engaging part 46c are bent in the dogleg shape. The same applies to the right engaging part 46d and the back engaging part 46e. The bent tip portions 96, 97 deform so as to increase the value of the bending angles $\alpha$, $\beta$ when the bent tip portions 96, 97 go over the plurality of lower bulges 78 provided on the front plate 50, the left side plate 52, the right side plate 54, the back plate 56, and the concave portion side plate 60 of the housing 42. This facilitates the engagement of the bent tip portions 96, 97 with the plurality of lower bulges. When the tip portions 96, 97 of the front engaging part 46b, the left engaging part 46c, the right engaging part 46d, and the back engaging part 46e of the bottom cover 46 completely go over the plurality of lower bulges 78, the tip portions 96, 97 firmly engage with the plurality of lower bulges 78 so that falling off of the bottom cover 46 from the shield case 22 is prevented.

Figure 15A:
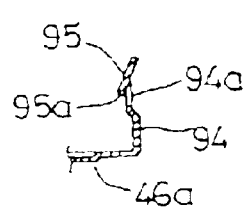
FIG. 15A shows a vertical cross-section of a latching part 94 of the bottom cover 46.
Figure 15B:
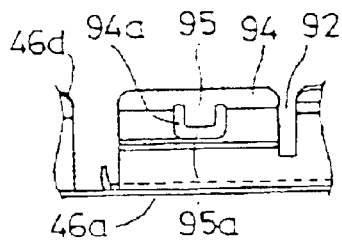
FIG. 15B shows an enlarged side elevational view of the latching part 94 of the bottom cover 46.

FIG. 15A shows a vertical cross-sectional view of the latching part 94 of the bottom cover 46 and FIG. 15B shows an enlarged side elevational view of the latching part 94 of the bottom cover 46.

As shown in FIG. 15A and FIG. 15B, in the middle of the latching parts 94 that are bent upward from both side ends of the bottom surface 46a, a slit 94a in the shape of a horseshoe is cut out and the latching piece 95 is formed thereby, respectively. The upper end of the latching piece 95 is made integral with the latching part 94 and is configured so that the lower end 95a of the latching piece 95 diagonally enters into the interior space of the housing 42.

Figure 16A:
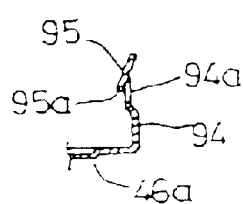
FIG. 16A shows an enlarged side elevational view of the latching part 94 of the bottom cover 46, which is latched onto the housing 42.
Figure 16B:
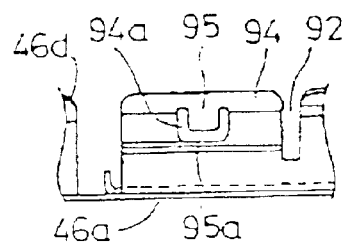
FIG. 16B shows a vertical cross-sectional view of the latching part 94 of the bottom cover 46, which is latched onto the housing 42.

FIG. 16A shows an enlarged side elevational view of the status when the latching part 94 of the bottom cover 46 is engaged with the housing 42a and FIG. 16B shows a vertical cross-sectional view of the status when the latching part 94 of the bottom cover 46 is engaged with the housing 42.

As shown in FIG. 16A and FIG. 16B, when the bottom cover 46 is mounted to the bottom portion of the housing 42, the bottom ends 95a of the latching pieces 95 fit into the lower latching holes 82 of the housing 42. Accordingly, it is assured that even when an exterior force is applied, the falling off of the bottom cover 46 from the housing 42 is prevented because the bottom ends 95a of the latching pieces 95 are contacting the rim portions of the lower latching holes 82.

Accordingly, in the present invention, there is provided a shield case for an electronic apparatus that accommodates a board arranged with an electronic component and a connector provided with a protrusion, which shield case comprises a connector accommodating part that comprises two side surfaces (72, 74) and a back surface (70), and a cover (44) that forms a portion of the shield case. Each of the two side surfaces comprises a vertical plane (72, 74) that extends in a forward direction (Ya direction) that extends away from the interior of the shield case and a backward direction (Yb direction) that extends toward the interior of the shield case, a vertical edge (72a1/74a1) provided in the vertical plane, and a horizontal edge (72a2/74a2) provided in the vertical plane. The vertical planes of the two side surfaces support the connector therebetween, thereby controlling a mounting position of the connector in a lateral direction (Xa–Xb directions). The vertical edge of the vertical plane contacts the protrusion of the connector thereby controlling a mounting position of the connector in the forward direction (Ya direction). The horizontal edge of the vertical plane contacts the protrusion provided on the connector thereby controlling a mounting position of the connector in a vertical direction (Zb direction). The back surface contacts a back surface of the connector so as to control a mounting position of the connector in the backward direction (Yb direction). The cover covers the connector accommodating part so as to control a mounting position of the connector in the other vertical direction (Za direction).

The following is a description of a modification example of the embodiment of the present invention.

Figure 17:
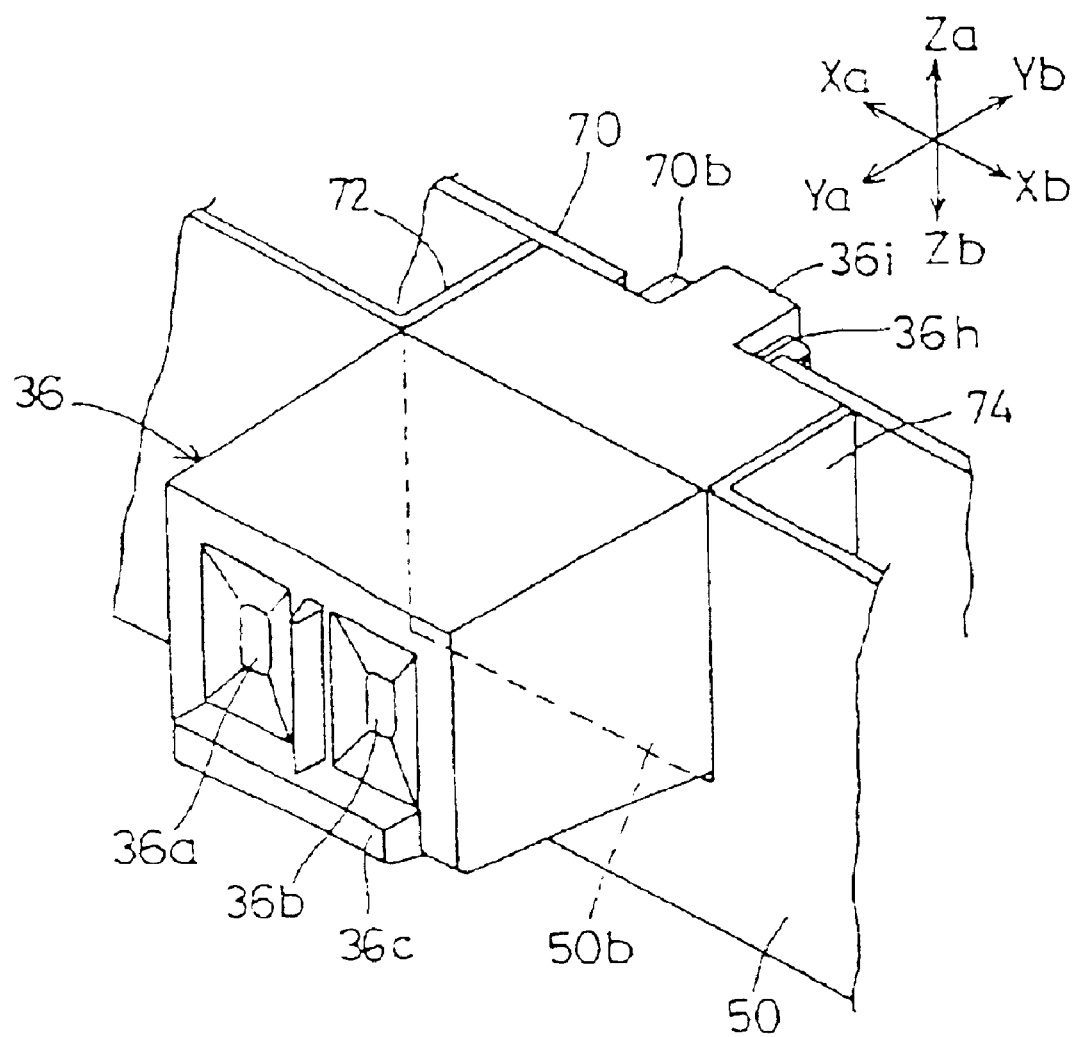
FIG. 17 shows a perspective view of a mounting configuration of a modification example of the AM input connector 36.
Figure 18A:
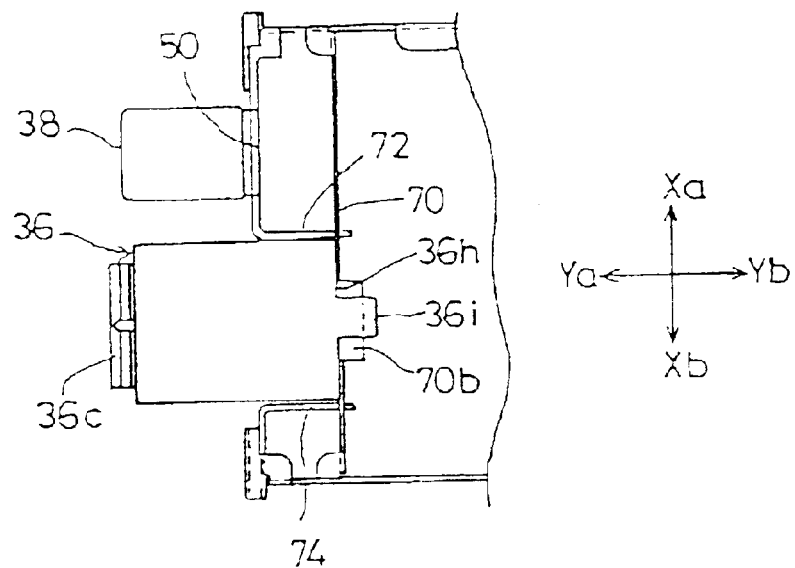
FIG. 18A shows a plan view of the modification example of the AM input connector 36 in a mounted status.
Figure 18B:
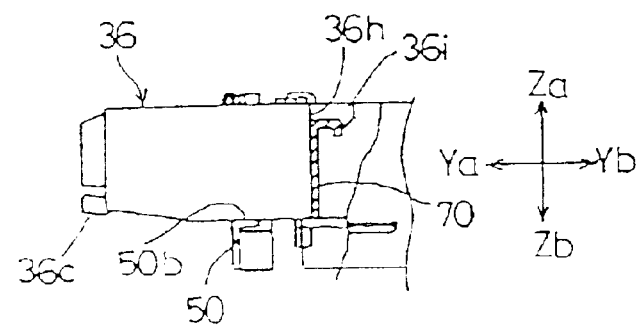
FIG. 18B shows a side elevational view of the modification example of the AM input connector 36 in a mounted status.

FIG. 17 shows a perspective view of a mounting configuration of the modification example of the AM input connector 36. FIG. 18A and FIG. 18B show the AM input connector 36 in a mounted status. More particularly, FIG. 8A shows a plan view of the AM input connector 36 in the mounted status and FIG. 18B shows a side elevational view of the AM input connector 36 in the mounted status. In FIG. 17, FIG. 18A, and FIG. 18B, the parts that are similar to those in FIG. 6 and FIG. 7A through FIG. 7C will be denoted by the same reference numerals and thus the descriptions of which are omitted.

As shown in FIG. 17, FIG. 18A, and FIG. 18B, the modification example of the AM input connector 36 is provided with a latching pawl 36i that protrudes backward (in the Yb direction) from the back surface 36h of the AM input connector 36. The latching pawl 36i latches onto a concave portion 70j that is provided on the dividing plate (shield case wall) 70 facing the back surface 36h of the AM input connector 36.

In this modification example of the AM input connector 36, the position of the AM input connector 36 in the forward direction (Ya direction) is determined by having the latching pawl 36i on the back surface side of the AM input connector 36 latching onto the concave portion 70j and the position of the AM input connector 36 in the backward direction (Yb direction) is determined by having the back surface 36h contacting the dividing plate 70. Accordingly, since in this modification example of the AM input connector 36, no protrusions such as protrusions 36f, 36g are provided on the left side surface and the right side surface of the AM input connector 36, respectively, the width in the Xa–Xb directions is reduced as compared to the AM input connector 36 according to the embodiment of the present invention and thus enabling the modification example of the AM input connector 36 to be used in narrow spaces.

Accordingly, in the modification example of the AM input connector 36, shaking in the back-and-forth directions (Ya–Yb directions) is prevented by having the latching pawl 36i latched onto the concave portion 70j provided on the dividing plate 70. Therefore, it is not necessary for the shield case for the electronic apparatus 20 to have a configuration so as to contact the housing (back surface panel) of a stereo device in order to prevent the shaking in the back-and-forth directions. Therefore, more freedom for back surface panel configuration of the stereo device can be provided and thus reducing the burden of the manufacturers when manufacturing the stereo devices.

It is noted that in the above embodiment, the descriptions are given with respect to an FM/AM tuner, however, the present invention is not limited thereto and the present invention can be applied to electronic apparatus other than an FM/AM tuner.

Further, the present invention is not limited to the above embodiment, and variations and modifications may be made without departing from the scope of the present invention.

The present application is based on Japanese priority application No. 2002-001194 filed on (Jan. 8, 2002), the entire contents of which are hereby incorporated by reference.

What is claimed is:

1. A shield case for an electronic apparatus that accommodates a board arranged with an electronic component and a connector comprising:

a housing that comprises a plurality of housing walls;

a top cover that covers an upper portion of said housing; and a bottom cover that covers a bottom portion of said housing, wherein, said connector is provided with a protrusion;

one of the housing walls is provided with a concave portion;

said protrusion provided on the connector engages with the concave portion provided on said one of the housing walls; and said housing further comprises a connector accommodating part having two side surfaces and a back surface, each of said side surfaces having a vertical plane that extends on a forward direction.

2. The shield case as claimed in claim 1, wherein, said top cover is provided with a connector-gripping portion that grips said connector from the top.

3. A shield case for an electronic apparatus that accommodates a board arranged with an electronic component and a connector comprising:

a housing that comprises a plurality of housing walls;

a top cover that covers an upper portion of said housing; and a bottom cover that covers a bottom portion of said housing, wherein, the connector is provided with a protrusion;

one of the housing walls is provided with a contacting portion;

another one of the housing walls contacts said protrusin provided on the connector; and said contacting portion contacts a back surface of the connector so as to control a position of the connector in a direction toward an interior space of said housing.

4. The shield case as claimed in claim 3, wherein, said top cover is provided with a connector-gripping portion that grips the connector from the top.

5. A shield case for an electronic apparatus that accommodates a board arranged with an electronic component and a connector provided with a protrusion comprising:

a connector accommodating part that comprises two side surfaces and a back surface; and a cover that forms a portion of said shield case; wherein, each of said two side surfaces comprises a vertical plane that extends in a forward direction that extends away from the interior of said shield case and a backward direction that extends toward the interior of said shield case, and a vertical edge provided in said vertical plane;

said vertical planes of said two side surfaces support the connector therebetween, thereby controlling a mounting position of the connector in a lateral direction;

said vertical edge of said vertical plane contacts the protrusion of the connector thereby controlling a mounting position of the connector in the forward direction;

said back surface of said connector accommodating part contacts a back surface of the connector so as to control a mounting position of the connector in the backward direction; and said cover covers said connector accommodating part so as to control a mounting position of the connector in a vertical direction.

6. The shield case as claimed in claim 5, wherein, said two side surfaces comprise supporting plates that support both side surfaces of the connector when the connector is held by said connector-accommodating part; and said vertical edge of respective vertical planes forms a notch with which the protrusion of the connector engages.

7. The shield case as claimed in claim 5, wherein, said back surface is provided with a contacting portion locally protruding so as to contact the back surface of the connector in order to control the mounting position of the connector in the backward direction.

8. The shield case as claimed in claim 5, wherein, said cover comprises a connector-gripping portion that is locally protruding and grips the connector from the top.

9. A connector retaining mechanism comprising:

a shield case claimed in claim 5 for shielding an electronic apparatus from electronic/magnetic/electromagnetic noise from the exterior; and a connector for electrically connecting the electronic apparatus with an exterior electronic apparatus.

10. A shield case for an electronic apparatus that accommodates a board arranged with an electronic component and a connector comprising:

a housing that comprises a plurality of housing walls;

a top cover that covers an upper portion of said housing; and a bottom cover that caverg a bottom portion of said housing; wherein, the connector is provided with a protrusion;

said housing further comprises a connector accommodating part having two sides surfaces and a back surface, each of the said side surfaces having a vertical plane that extends in a forward direction and a vertical edge provided in said vertical plane;

said back surface of the connector accommodating part is provided with a contacting portion; and the connector is held in said connector accommodating part by said protrusion of the connector contacting said vertical edge and by said contacting portion contacting a back surface of the connector.

11. The shield case as claimed in claim 10, wherein, said top cover is provided with a connector-gripping portion that grips said connector from the top.

* * * * *